United States Patent
Cheng et al.

(10) Patent No.: US 8,766,360 B2
(45) Date of Patent: Jul. 1, 2014

(54) INSULATIVE CAP FOR BORDERLESS SELF-ALIGNING CONTACT IN SEMICONDUCTOR DEVICE

(71) Applicant: International Business Machines Corporation, Armonk, NY (US)

(72) Inventors: Kangguo Cheng, Schenectady, NY (US); Junli Wang, Singerlands, NY (US); Keith Kwong Hon Wong, Wappingers Falls, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/674,225

(22) Filed: Nov. 12, 2012

(65) Prior Publication Data

US 2014/0117423 A1    May 1, 2014

Related U.S. Application Data

(63) Continuation of application No. 13/664,955, filed on Oct. 31, 2012.

(51) Int. Cl.
*H01L 21/02* (2006.01)
(52) U.S. Cl.
USPC ........................................................ 257/346
(58) Field of Classification Search
USPC ........................................................ 257/346
See application file for complete search history.

(56) References Cited

U.S. PATENT DOCUMENTS

| | | | |
|---|---|---|---|
| 6,939,768 B2 | 9/2005 | Jeng | |
| 7,115,954 B2 | 10/2006 | Shimizu et al. | |
| 7,544,594 B2 | 6/2009 | Change | |
| 7,749,849 B2 | 7/2010 | Hu et al. | |
| 7,867,863 B2 | 1/2011 | Chang | |
| 2007/0184656 A1 | 8/2007 | Sherman et al. | |
| 2008/0290416 A1 | 11/2008 | Yu et al. | |
| 2011/0117738 A1 | 5/2011 | Russell et al. | |
| 2011/0156107 A1 | 6/2011 | Bohr et al. | |
| 2013/0040450 A1* | 2/2013 | Xie et al. | 438/593 |

OTHER PUBLICATIONS

B. White et al., "Ultra low-k integration solutions using GCIB processing," Proceedings of the IEEE 2004 International Interconnect Technology Conference, Jun. 7-9, 2004, pp. 193-195.
W. Skinner et al., "Infusion processing for advanced transistor manufacturing," The 17th Annual SEMI/IEEE Advanced Semiconductor Manufacturing Conference, ASMC, 2006, pp. 172-176.
I. Yamada et al., "Recent advances in R&D of gas cluster ion beam processes and equipment", Nuclear Instruments and Methods in Physics Research Section B: Beam Interactions with Materials and Atoms, vol. 241, Issues 1-4, Dec. 2005, pp. 589-593.

* cited by examiner

*Primary Examiner* — Bradley K Smith
(74) *Attorney, Agent, or Firm* — Harrington & Smith

(57) ABSTRACT

An apparatus comprises: a semiconductor device on a base substrate, the semiconductor device having a core metal positioned proximate a source and a drain in the base substrate; a work function metal on a portion of the core metal; a dielectric liner on a portion of the work function metal; a metal gate in electrical communication with one of the source and the drain; and an insulator film implanted into the core metal, the insulator film forming an insulative barrier across the metal gate and between the core metal and the source or the drain.

13 Claims, 5 Drawing Sheets

INSULATIVE CAP FOR BORDERLESS SELF-ALIGNING CONTACT IN SEMICONDUCTOR DEVICE

CROSS REFERENCE TO RELATED APPLICATION

This application is a continuation of copending U.S. patent application Ser. No. 13/664,955, filed Oct. 31, 2012, the disclosure of which is incorporated by reference herein in its entirety.

BACKGROUND

The exemplary embodiments of this invention relate generally to semiconductor devices and, more particularly, to metal gates for use with borderless self-aligning contacts in semiconductor devices.

In the manufacture of an integrated circuit (IC) chip, various semiconductor devices (such as field effect transistors) can be fabricated on a supporting substrate using various deposition techniques. Current flows within the semiconductor device from a source to a drain. A gate generates an electric field that controls the current flow.

Precise alignment of the semiconductor device to maintain contact with the source, drain, and gate is not always possible, particularly as the number of devices on an IC chip increases or as trends in semiconductor fabrication progress toward further size reduction. In either case, the use of "borderless" self-aligning contacts (SACs) is employed. In the technology of borderless SACs, the edges of a gate or gate conductor may overlap the source or drain and contact the semiconductor device without interfering with the operation of the semiconductor device.

Gates and gate conductors in semiconductor devices have typically been fabricated of polysilicon. In order to obtain faster speeds in semiconductors, polysilicon gates can be replaced with metal gates. However, current semiconductor manufacturing technology does not support suitable control in the operation of semiconductor devices employing these replacement metal gates (RMGs) in conjunction with borderless SACs.

BRIEF SUMMARY

In one exemplary aspect, an apparatus comprises: a semiconductor device on a base substrate, the semiconductor device having a core metal positioned proximate a source and a drain in the base substrate; a work function metal on a portion of the core metal; a dielectric liner on a portion of the work function metal; a metal gate in electrical communication with one of the source and the drain; and an insulator film implanted into the core metal, the insulator film forming an insulative barrier across the metal gate and between the core metal and the source or the drain.

In another exemplary aspect, an apparatus comprises: a base substrate; an oxide layer on the base substrate; a dielectric top layer over the oxide layer; one of an NFET and a PFET partially in the oxide layer and partially extending into an opening formed in the oxide layer, the opening extending to a source or a drain in the base substrate to define a borderless self-aligning contact; and a metal gate in the opening extending to the source or the drain in the base substrate. The NFET or PFET has a core metal positioned proximate the source or the drain in the base substrate and an insulator film implanted into the core metal. The insulator film forms an insulative barrier across the metal gate and between the core metal of the field effect transistor and the source or drain.

In another exemplary aspect, a method comprises: forming a semiconductor device on a base substrate, the semiconductor device having a core metal positioned proximate a source and a drain in the base substrate, a work function metal on a portion of the core metal, and a dielectric layer on a portion of the work function metal; forming a metal gate in electrical communication with one of the source and the drain; and implanting an insulator film on the core metal of the semiconductor device. The insulator film on the core metal forms an insulative barrier across the metal gate and between the core metal of the semiconductor device and the source or the drain.

In another exemplary aspect, a method comprises: forming one of an NFET and a PFET on a base substrate, the NFET or the PFET comprising a core metal positioned proximate a source and a drain in the base substrate; forming a metal gate in electrical communication with one of the source and the drain; and implanting ions into a surface of the core metal of the NFET or the PFET between the core metal and the metal gate to form an insulator film. The insulator film on the core metal forms an insulative barrier between the core metal of the NFET or PFET and the metal gate.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

In accordance with exemplary embodiments described herein, a complementary metal oxide semiconductor (CMOS) device includes N-type and P-type metal oxide semiconductor field effect transistors (MOSFETs) to create paths to an output from either a voltage source or a ground.

Efforts are being made to fabricate CMOS devices using 14 nanometer (nm) node technology in order to pack more devices into a smaller area on an integrated circuit (IC) chip. In a CMOS device employing 14 nm node technology, the node defines a borderless self-aligning contact (SAC) system that allows for the connection of the gate to control the flow of current through the CMOS device.

Although gates have typically been fabricated of polysilicon, current trends point to the use of metal to replace the polysilicon. Accordingly, metal gates used to replace polysilicon gates are known as replacement metal gates (RMGs). In using an RMG with a borderless SAC, however, the metal of the gate may cause undesired electrical communication (shorting) across the semiconductor device and the drain, which may compromise the operation of the CMOS device and the IC chip.

Figure 1:
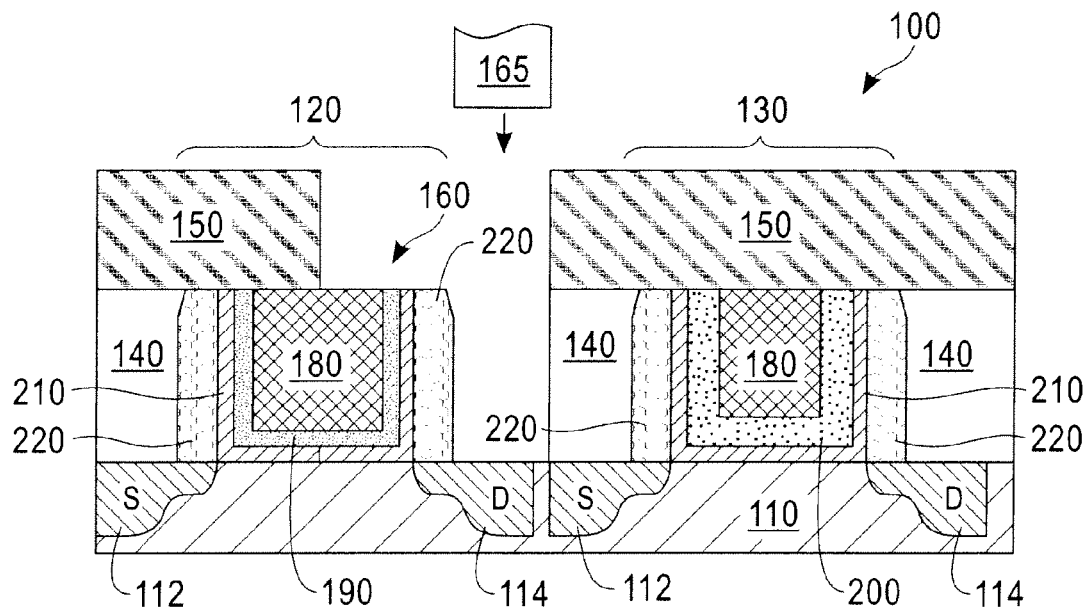
FIG. 1 is a side cross-sectional view of a CMOS structure having an NFET and a PFET and incorporating borderless SAC.

As shown in FIG. 1, a CMOS device incorporating borderless SAC is designated generally by the reference number 100 and is hereinafter referred to as "CMOS 100." The CMOS 100 comprises a base substrate 110 on which at least one N-type MOSFET 120 (NFET 120) and at least one P-type MOSFET 130 (PFET 130) are formed in an overlying layer of an oxide dielectric material (hereinafter "oxide layer 140"). Areas of the base substrate 110 proximate the NFET 120 (as well as the PFET 130) define source regions 112 and drain regions 114. A dielectric top film 150 is deposited over the oxide layer 140. A node 160 is formed in the dielectric top film 150 and the oxide layer 140, the node 160 being configured to receive an RMG 165 to control current flow from the NFET 120 to the drain 114. As shown, the NFET 120 is partially disposed in the oxide layer 140 and partially covered by the dielectric top film 150.

The base substrate 110 may comprise a silicon-on-insulator (SOI) substrate or bulk silicon. Other materials from which the base substrate 110 may be fabricated include, but are not limited to, silicon carbide (SiC), silicon alloys, germanium, germanium alloys, gallium arsenide (GaAs), indium phosphide (InP), and the like.

The oxide material of the oxide layer 140 may comprise silicon dioxide, which may or may not be doped with phosphorus and/or boron.

Both the NFET 120 and the PFET 130 comprise a core metal 180, the core metal 180 being copper, silver, aluminum, gold, chromium, magnesium, titanium, or nickel. In the exemplary embodiment of FIG. 1, the core metal 180 is aluminum. A layer of an n-doped work function metal 190 (NWFM 190) is deposited on the core metal 180 of the NFET 120, and a layer of a p-doped work function metal 200 (PWFM 200) is deposited on the core metal 180 of the PFET 130. The NWFM 190 and the PWFM 200 may be titanium, titanium nitride (TiN), tantalum, tantalum nitride (TaN), ruthenium, alloys of any of the foregoing materials, or the like. The PFET 130 is similar to the NFET 120 but may include more or less of the core metal 180.

Liner layers 210 of high k dielectric material are deposited on surfaces of the NWFM 190 and the PWFM 200 as insulative barriers to insulate the NFET 120 and the PFET 130 from the base substrate 110. The high k dielectric material of the liner layers 210 may be hafnium silicate, zirconium silicate, hafnium dioxide, zirconium dioxide, combinations of the foregoing, and the like. Spacers 220 are formed on the liner layers 210 on sides of the NFET 120 and the PFET 130. The spacers 220 may be silicon nitride (SiN) or the like.

Still referring to FIG. 1, the NFET 120 in the CMOS 100 is partially exposed such that a surface of the NFET 120 is open to the node 160. The node 160 is configured to allow for the borderless SAC of the RMG 165 with the drain 114 proximate the NFET 120. A surface of the PFET 130 may or may not be exposed to a second node (not shown). Because the NFET 120 is partially exposed to the node 160, the insertion of the RMG 165 into the node 160 to form a nodal interconnection may cause electrical communication (a short) to occur across the metal of the NFET 120 and the drain 114 associated with the NFET 120.

Figure 2:
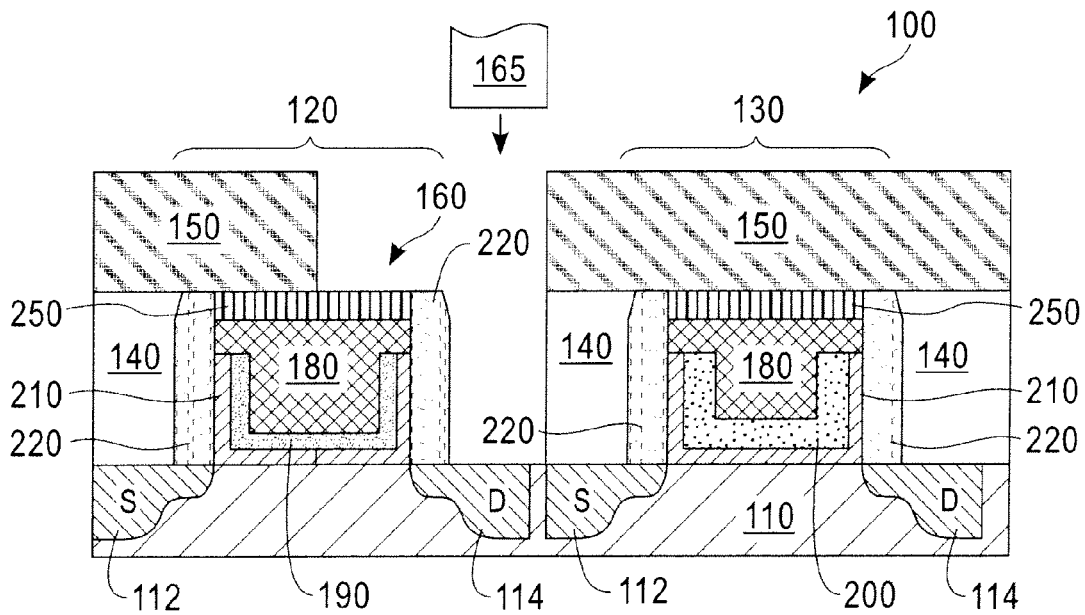
FIG. 2 is a side cross-sectional view of one exemplary embodiment of the CMOS structure of FIG. 1 incorporating an insulator film into the NFET and PFET.

As shown in FIG. 2, the NFET 120 includes an insulator film 250. The insulator film 250 is a cap that is implanted into the core metal 180 of the NFET 120 at the interface of the NFET 120 and the dielectric top film 150. As shown, the insulator film 250 is relatively shallow with regard to the core metal 180 and does not contact the NWFM 190 or the liner layer 210. Although the disclosure herein describes the insulator film 250 of the NFET 120, a similar insulator film 250 may be implanted into the core metal 180 of the PFET 130 at the interface of the PFET 130 and the dielectric top film 150.

Insertion of the RMG 165 into the node 160 allows the RMG 165 to suitably engage the borderless SAC, thereby providing a suitably solid nodal interconnection. In maintaining the suitably solid nodal interconnection in the borderless SAC, the insulator film 250 of the NFET 120 forms an insulative barrier that prevents or at least inhibits shorting across the RMG 165 between the core metal 180 of the NFET 120 and the drain 114. The resulting insulator film 250 will also prevent the contact of the NFET 120 (and PFET 130) by a reactive ion etch.

Figure 3:
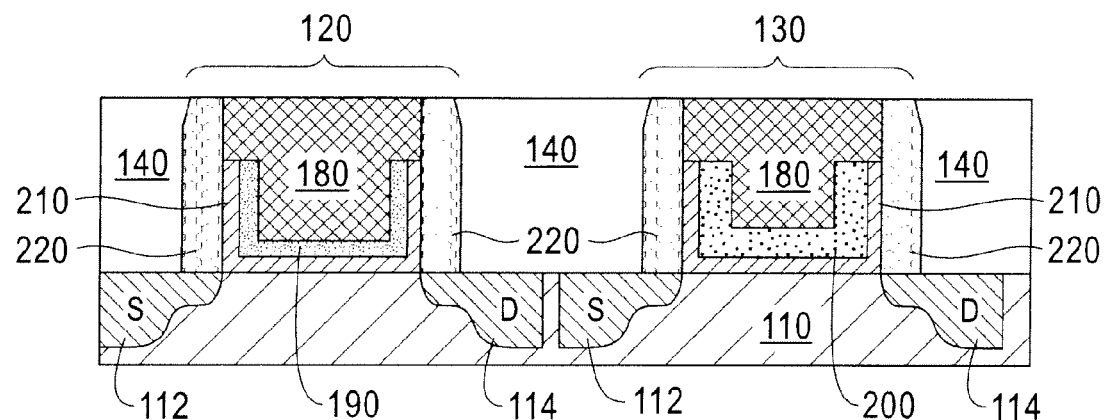
FIG. 3 is a side cross-sectional view of a step in the manufacture of the CMOS structure of FIG. 2 in which the NFET and PFET are disposed in an oxide layer.

In the fabrication of the CMOS, as shown in FIG. 3, the NFET 120 and the PFET 130 are formed on the base substrate 110 using various deposition techniques (chemical vapor deposition (CVD), physical vapor deposition (PVD), and atomic layer deposition (ALD)), masking, and etching processes. In doing so, the liner layers 210 and the NWFM 190 and PWFM 200 extend to an upper surface of each respective NFET 120 and PFET 130 (as shown in FIG. 1). Portions of the NWFM 190 and PWFM 200 and the respective liner layers 210 are etched back, and trenches are formed in the NWFM 190 and PWFM 200. The trenches are filled with the core metal 180 (e.g., aluminum, copper, silver, gold, chromium, magnesium, titanium, nickel, or tungsten) such that the metal is deposited over the upper edges of the etched back liner layers 210, NWFM 190, and PWFM 200, thereby overfilling the trenches.

The NFET 120 and the PFET 130 are masked, and the oxide layer 140 is deposited on the base substrate 110 using CVD or oxidation. The core metal 180 and the oxide layer 140 are then planarized using a chemical mechanical polish (CMP).

Figure 4:
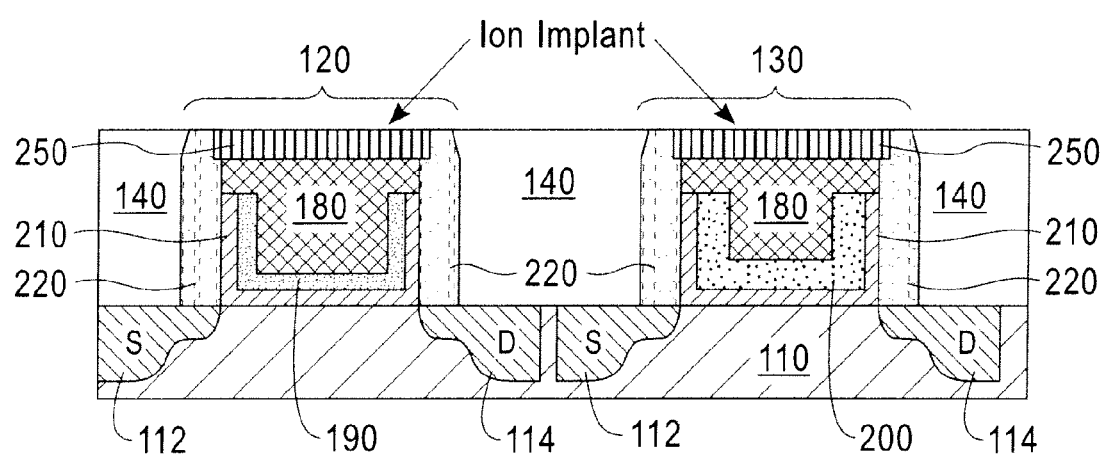
FIG. 4 is a side cross-sectional view of a step in the manufacture of the structure of FIG. 3 in which the insulator film is implanted into the NFET and PFET.

As shown in FIG. 4, the insulator films 250 are formed on the core metal 180 of the NFET 120 and PFET 130 using a gas cluster ion beam (GCIB) implant technique. The GCIB implant technique provides an implantation of selected ions into a surface (e.g., the top surface of the NFET 120) to a desirably shallow depth. The ions implanted may be oxygen and/or nitrogen to provide the corresponding oxide and/or nitride. When the core metal 180 of the NFET 120 (and the PFET 130) comprises aluminum, the insulator film is oxidized to $Al_2O_3$ and/or nitrided to AlN. When the core metals 180 are any other metal, the insulator films 250 are accordingly oxidized or nitrided. For example, if the core metal 180 is titanium, the titanium is oxidized and/or nitrided to titanium nitrogen oxides ($TiNO_x$) and/or TiN.

Using the GCIB implant technique, the selected ions are implanted into the surfaces of the NFET 120 and PFET 130 at room temperature (about 20 degrees C. to about 30 degrees C.) with a beam energy of about 10 kilo electron volts (keV) to about 1,000 keV. In semiconductor devices employing the 14 nm node technology, the selected ions are implanted to a depth of about 10 nm to about 30 nm. The selected ions may also be implanted into portions of the spacers 220 without detrimental effect. In implanting the ions, the surface of the core metal 180 is converted to an insulator. The depth to which the ions are deposited is well-controlled and such that contact with the NWFM 190 and the liner layer 210 is avoided. If the ions (oxygen and/or nitrogen) are implanted to an excessive depth, then the work function of the gate metal can be undesirably altered. After implanting the selected ions, the structure may be subjected to an annealing process.

Figure 5:
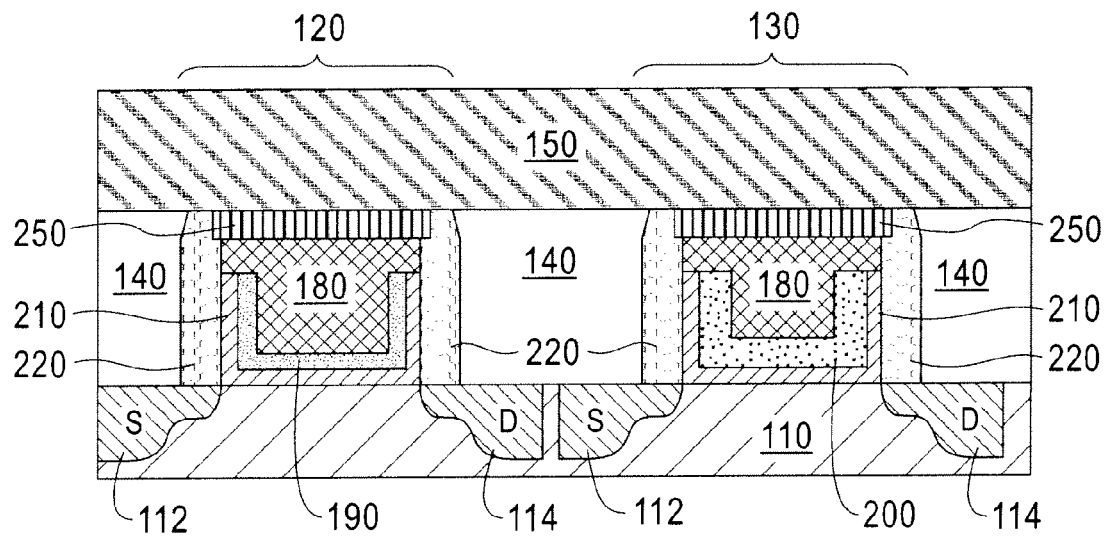
FIG. 5 is a side cross-sectional view of a step in the manufacture of the structure of FIG. 4 in which a dielectric top film is deposited on the NFET, PFET, and oxide layer.

As shown in FIG. 5, the dielectric top film 150 is deposited over the NFET 120 and PFET 130 and the oxide layer 140. The dielectric top film 150 (which may be $SiO_2$) is deposited using CVD. Photoresist or other masking is applied to the dielectric top film 150 in the desired areas, and etching is used to form the node 160 defining the borderless SAC area, as shown in FIG. 2.

Figure 6:
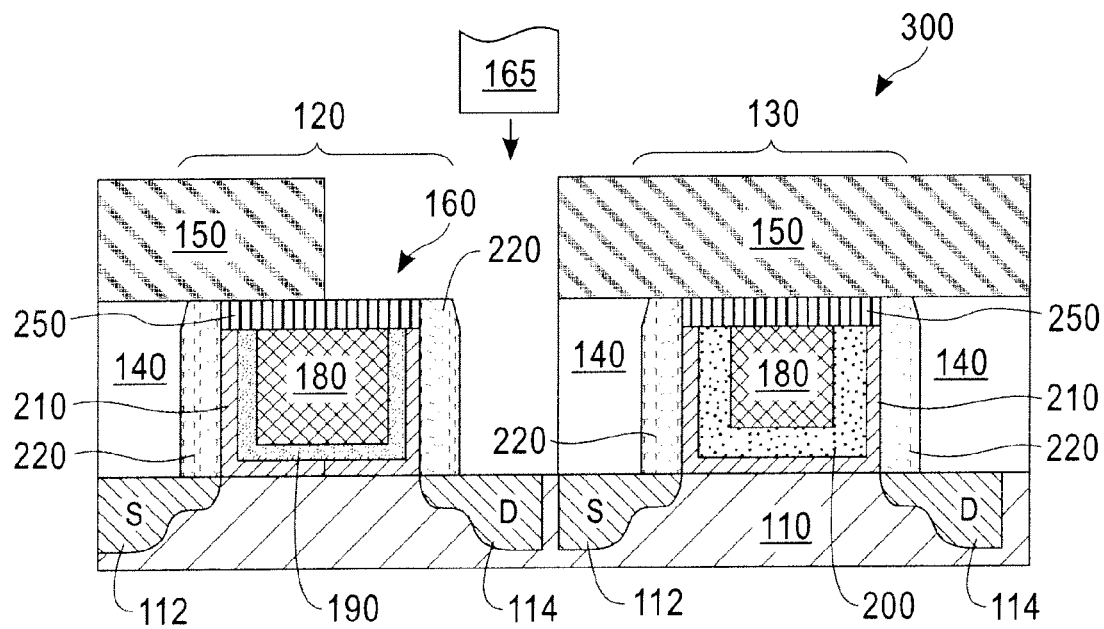
FIG. 6 is a side cross-sectional view of a second exemplary embodiment of the CMOS structure of FIG. 1 incorporating an insulator film into the NFET and PFET.

As shown in FIG. 6, another embodiment of a CMOS is shown generally at 300. In the CMOS 300, the insulator film 250 extends into the core material 180 of the NFET 120 and makes contact with the NWFM 190 and the liner layer 210 to form an insulative barrier that prevents or at least inhibits shorting across the RMG 165 between the core metal 180 of the NFET 120 and the drain 114. Similarly, the insulator film 250 in the PFET 130 may extend into the core material 180 of the PFET 130 and contact the PWFM 200 and the liner layer 210 thereof.

Figure 7:
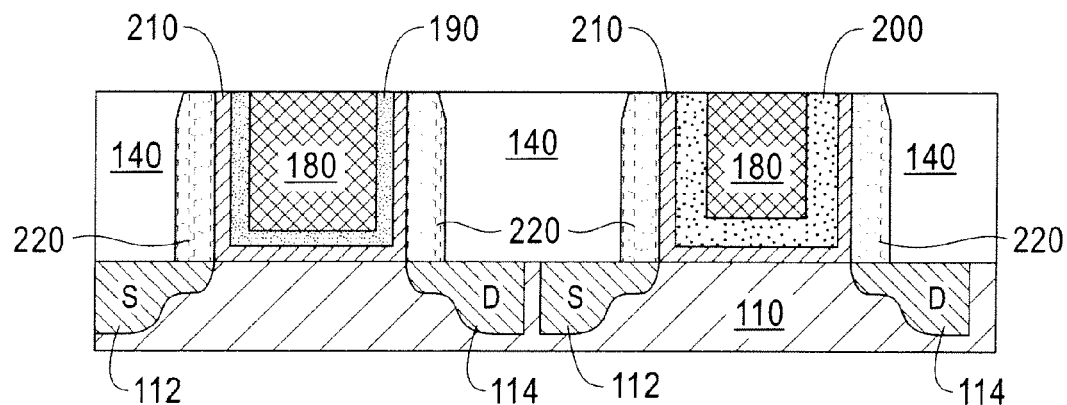
FIG. 7 is a side cross-sectional view of a step in the manufacture of the CMOS structure of FIG. 6 in which the NFET and PFET are disposed in an oxide layer.

In fabricating the CMOS 300 in which the insulator film(s) 250 make contact with the NWFM 190 and the liner layer 210, as shown in FIG. 7, the NFET 120 and the PFET 130 are deposited in a manner similar to that described above with regard to FIG. 3. In filling the trenches in the NWFM 190 and the PWFM 200 with the core material 180, however, the NWFM 190, PWFM 200, and liner layers 210 are not etched back, and the core material 180 is not deposited over the upper edges thereof. The oxide layer 140 is also deposited in a manner similar to that described above with regard to FIG. 3. The core metal 180, the upper edges of the NWFM 190, PWFM 200, and liner layers 210, and the oxide layer 140 are then planarized using CMP.

Figure 8:
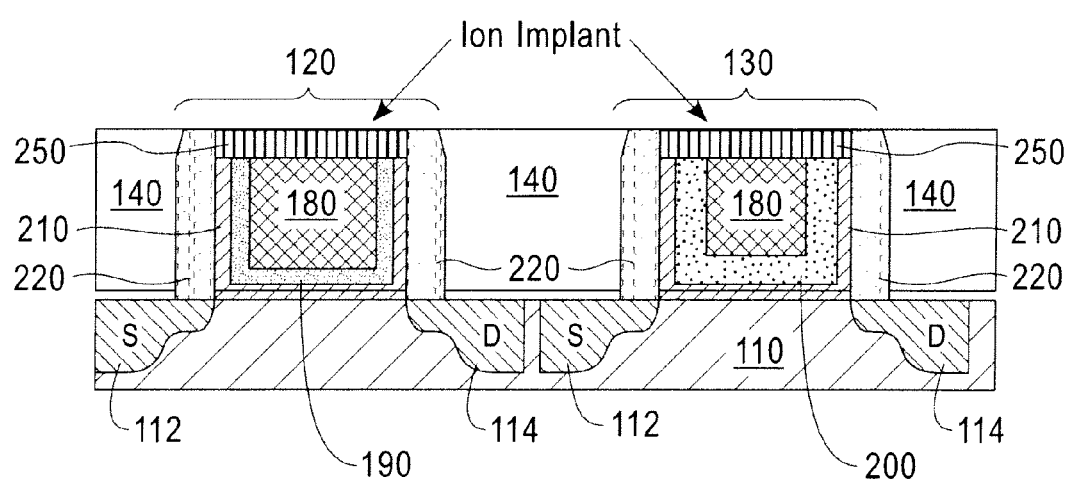
FIG. 8 is a side cross-sectional view of a step in the manufacture of the structure of FIG. 7 in which the insulator film is implanted into the NFET and PFET.

As shown in FIG. 8, the insulator films 250 are formed on the core metal 180 of the NFET 120 and the PFET 130 using the GCIB implant technique. Selected ions (e.g., oxygen and/or nitrogen) are implanted via the GCIB implant technique to a desirably shallow depth into the surfaces of the core metal 180 (e.g., at room temperature with a beam energy of about 10 kilo keV to about 1,000 keV) to convert the surface of the core metal 180 to an insulator. The depth to which the ions are deposited (about 10 nm to about 30 nm) is controlled such that the ions contact upper edges of the NWFM 190, PWFM 200, and liner layers 210. As with the previously-described embodiment, shallow implantation of the ions is carried out in order to avoid the undesirable alteration of the work function of the gate metal. After implanting the selected ions, the structure may be subjected to an annealing process.

Figure 9:
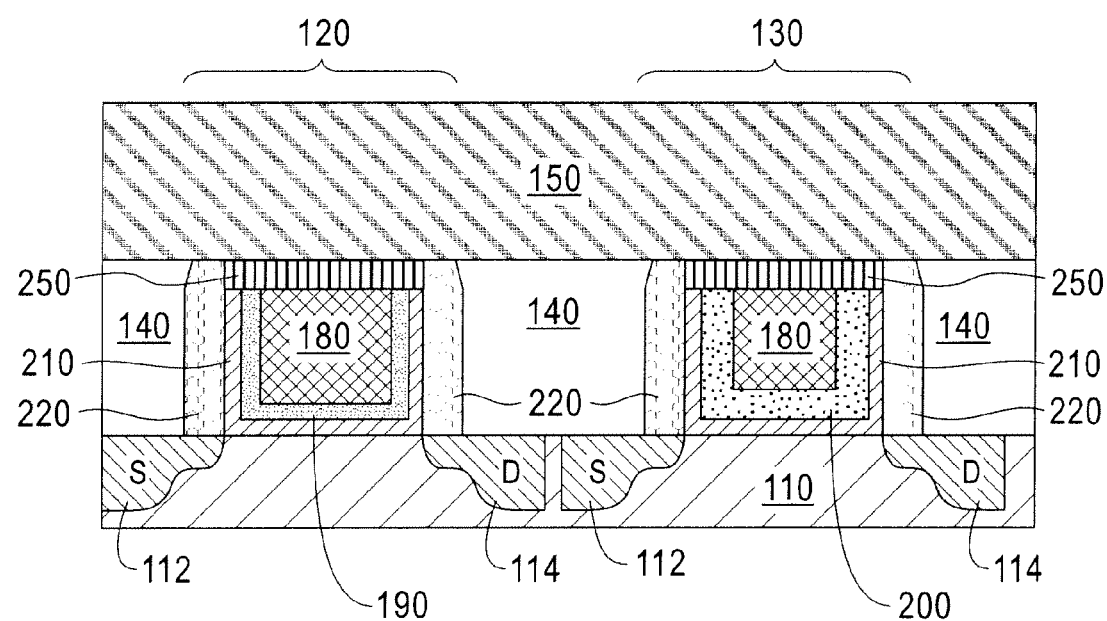
FIG. 9 is a side cross-sectional view of a step in the manufacture of the structure of FIG. 8 in which a dielectric top film is deposited on the NFET, PFET, and oxide layer.

As shown in FIG. 9, the dielectric top film 150 (e.g., $SiO_2$) is deposited over the NFET 120, PFET 130, and oxide layer 140. The dielectric top film 150 is deposited using CVD. Photoresist or other masking is applied, and etching is used to form the node 160 defining the borderless SAC area to produce the CMOS 300 as shown in FIG. 6.

The exemplary methods and techniques described herein may be used in the fabrication of semiconductor devices for use in IC chips. The resulting IC chips can be distributed in raw wafer form (i.e. as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements, and/or other signal processing devices as part of either (a) an intermediate product, such as a motherboard, or (b) an end product. The end product can be any product that includes IC chips.

The terminology used herein is for the purpose of describing particular exemplary embodiments only and is not intended to be limiting of the exemplary embodiments of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Any use of the terms "connected," "coupled," or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical, or any suitable combination thereof in accordance with the described exemplary embodiments. As non-limiting examples, the connection or coupling may comprise one or more printed electrical connections, wires, cables, mediums, or any suitable combination thereof.

Generally, various exemplary embodiments of the invention can be implemented in different mediums, such as software, hardware, logic, special purpose circuits, or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:
1. An apparatus, comprising:
 a semiconductor device on a base substrate, the semiconductor device having:
  a core metal positioned proximate a source and a drain in the base substrate;
  a work function metal on a portion of the core metal;
  a dielectric liner on a portion of the work function metal;
  a metal gate in electrical communication with one of the source and the drain; and an insulator film implanted into the core metal, the insulator film forming an insulative barrier across the metal gate and between the core metal and the source or the drain;

wherein the insulator film is not in contact with either the work function metal or the dielectric liner of the semiconductor device.

2. The apparatus of claim 1, wherein an opening in an oxide layer on the base substrate extends to the base substrate to define a borderless self-aligning contact for receiving the metal gate.

3. The apparatus of claim 1, wherein the insulator film extends to a depth so as to be in contact with the work function metal and the dielectric liner of the semiconductor device.

4. The apparatus of claim 1, wherein the semiconductor device is one of an NFET and a PFET.

5. The apparatus of claim 1, wherein the core metal is selected from the group consisting of copper, silver, aluminum, titanium, gold, chromium, magnesium, and nickel.

6. The apparatus of claim 1, wherein the insulator film comprises one or more of oxygen and nitrogen implanted into the core metal.

7. The apparatus of claim 1, wherein the core metal comprises aluminum and the insulator film comprises at least one of $Al_2O_3$ and AlN.

8. An apparatus, comprising:
a base substrate;
an oxide layer on the base substrate;
a dielectric top layer over the oxide layer;
one of an NFET and a PFET partially in the oxide layer and partially extending into an opening formed in the oxide layer, the opening extending to one of a source and a drain in the base substrate to define a borderless self-aligning contact, the NFET or PFET having:
a core metal positioned proximate the source or the drain in the base substrate; and
an insulator film implanted into the core metal; and
a metal gate in the opening extending to the source or the drain in the base substrate;
wherein the insulator film forms an insulative barrier across the metal gate and between the core metal and the source of the drain; and
wherein the insulator film is not in contact with either a work function metal or a dielectric liner of the NFET or PFET.

9. The apparatus of claim 8, wherein the insulator film extends to a depth so as to be in contact with a work function metal and a dielectric liner of the NFET ox PFET.

10. The apparatus of claim 8, wherein the core metal is selected from the group consisting of copper, silver, aluminum, titanium, gold, chromium, magnesium, and nickel.

11. The apparatus of claim 8, wherein the insulator film comprises one or more of oxygen and nitrogen implanted into the core metal.

12. The apparatus of claim 11, wherein the insulator film comprises one or more of a metal oxide and a metal nitride.

13. The apparatus of claim 11, wherein the one or more of oxygen and nitrogen are implanted using a gas cluster ion beam implant technique.

* * * * *